United States Patent [19]
Yamaguchi

[11] Patent Number: 6,136,479
[45] Date of Patent: Oct. 24, 2000

[54] METHOD OF FORMING PHOTOMASK AND PATTERN AND METHOD OF FORMING A SEMICONDUCTOR DEVICE

[75] Inventor: Atsumi Yamaguchi, Hyogo, Japan

[73] Assignee: Mitsubishi Denki Kabushiki Kaisha, Tokyo, Japan

[21] Appl. No.: 09/229,331

[22] Filed: Jan. 13, 1999

[30] Foreign Application Priority Data

Jul. 3, 1998 [JP] Japan .................................. 10-189076

[51] Int. Cl.⁷ ...................................................... G03F 9/00
[52] U.S. Cl. ........................................................ 430/5
[58] Field of Search ............................... 430/5, 311, 314, 430/394

[56] References Cited

U.S. PATENT DOCUMENTS 5,476,736  12/1995  Tanabe ...................................... 430/22
5,952,160   9/1999  Bakeman, Jr. et al. ................. 430/394

FOREIGN PATENT DOCUMENTS 63-80258  4/1988  Japan .

*Primary Examiner*—S. Rosasco
*Attorney, Agent, or Firm*—McDermott, Will & Emery

[57] ABSTRACT

A photomask where interconnection patterns and a contact hole pattern are drawn is used. According to the method, an overlay error due to a manufacturing error among reticles can be restricted.

14 Claims, 19 Drawing Sheets

METHOD OF FORMING PHOTOMASK AND PATTERN AND METHOD OF FORMING A SEMICONDUCTOR DEVICE

BACKGROUND OF THE INVENTION

1. Field of the Invention

The present invention generally relates to a method of forming patterns, and particularly to an improved method of forming patterns achieving a higher overlay accuracy. The present invention further relates to a photomask used for such a method of forming patterns. The present invention further relates to a method of forming a semiconductor device.

2. Description of the Background Art

In manufacturing semiconductor integrated circuits (semiconductor devices), an underlayer such as a semiconductor substrate is now selectively processed by the etching and ion implantation. In order to selectively protect the portions to be processed of the underlayer, patterns of the composition photosensitive to the source of active rays such as ultraviolet ray, x-ray, and electron beam, or of what is called photosensitive resist film (hereinafter referred to as resist) are formed on the underlayer.

The most common method of forming the resist patterns employs a reduction-type projection aligner (stepper) using as a source of rays g-line (wavelength 436 nm), i-line (wavelength 365 nm) or KrF excimer laser (wavelength 248 nm) to radiate ultraviolet ray.

When the stepper is used, a photomask is attached for exposure. The photomask is formed of a glass substrate on which a circuit pattern is formed by a blocking film such as the one formed of chromium (Cr). The photomask is referred to as reticle. In exposure, a precise overlay (registration) is required in order to correctly define the positional relation between the photomask and the circuit pattern which has already been generated on the substrate.

The pattern drawn at the photomask is reduced through a lens to be transferred onto a resist film applied onto a semiconductor substrate. Development of the resist film generates a resist pattern.

There are a positive resist and a negative resist. The positive resist has a portion on exposure to light which is dissolved in a developer and a portion not on exposure to light which is not dissolved in the developer. The negative resist has a portion on exposure to light which is not dissolved in the developer and a portion not on exposure to light which is dissolved in the developer.

The process of generating the resist pattern normally needs to be repeated 20–30 times for manufacturing a semiconductor integrated circuit device.

The higher integration and the higher performance of a semiconductor integrated circuit are being dramatically achieved now. Accordingly, further miniaturization of a circuit pattern is required. For example, in the 16-Mbit DRAM (Dynamic Random Access Memory) which is currently mass-produced, a resist pattern close to 0.4 $\mu$m is formed. A photolithography process applied for the generation of the resist pattern chiefly uses i-line in the ultraviolet ray.

For the 64-Mbit DRAM, mass production of which being started, requires a pattern of 0.35–0.3 $\mu$m. The 256-Mbit DRAM and the 1-Gbit DRAM in the stage of trial production or study and development need a pattern of 0.2 $\mu$m or less. For generating such a minute pattern, KrF excimer laser beam is practically used. Further, exposure by ArF excimer laser beam of a shorter wavelength (wavelength 193 nm) is considered to be effective.

As the pattern is miniaturized, enhancement of dimension accuracy and overlay accuracy is required. For example, a device having a capacity on the level with 256-Mbit DRAM needs dimension control of approximately ±0.03 $\mu$m relative to designed dimension as well as the overlay accuracy of approximately 0.06 $\mu$m. Such requirements will become severer.

The factors of degradation of the overlay accuracy are a magnification error of the exposure lens, a rotational error between a photomask (hereinafter referred to as reticle) and a chip formed already on a wafer, a measurement error in overlay inspection, and the like. However, the performance of the lens and the wafer stage of an exposure apparatus as well as the performance of an overlay measurement apparatus are improved and the overlay accuracy is being improved.

As the required precision in the overlay accuracy becomes severer, an error generated during manufacturing of the reticles has a larger influence on the overlay accuracy. In addition, as the degree of integration improves, an area where the pattern is drawn and the number of data of graphics increase to dramatically increase the time required for pattern generation by electron beam (EB) in manufacturing the reticle. As the degree of integration improves, it becomes difficult to restrict the error produced during reticle fabrication due to the influence of uniformity of resist application, development, and etching within the surface.

Next, a conventional method of forming patterns using one reticle for one process is described.

FIG. 39 is a plan view of a first reticle 19 used for exposure of a pattern of a contact hole. In the first reticle 19, a contact hole pattern 2 is drawn by electron beam.

FIG. 40 is a plan view of a second reticle 21 used for exposure of a pattern of an interconnection line connected electrically to the contact hole and other interconnection line patterns. Interconnection patterns 3b and 3e are formed by light blocking portions in the second reticle 21. An opening 3c is formed between interconnection patterns 3b and 3e. A part of interconnection pattern 3e has a larger interconnection width. The portion having the larger interconnection width corresponds to a portion connected to a contact. The interconnection width is made large in advance in order to give a margin.

A method of manufacturing a conventional semiconductor device using these reticles is next described.

Referring to FIG. 41, a silicon oxide film 5 is formed on a semiconductor substrate (e.g. silicon wafer) 4 to a thickness of approximately 3000 Å. A commercial KrF excimer positive resist film 10 is next applied thereon to a thickness of approximately 7000 Å. Using the first reticle 19 having contact hole pattern 2, exposure is performed by a stepper with KrF excimer laser (wavelength 248 nm) 11 as a source of rays. The exposure generates a latent image of the contact hole pattern in KrF excimer positive resist film 10.

Referring to FIG. 42, after bake at 110° C. for 90 seconds (post exposure bake: PEB), development performed for 60 seconds using an aqueous solution containing 2.38% tetramethyl ammonium hydroxide (TMAH) by weight produces a resist pattern 10c having an opening.

Referring to FIG. 43, silicon oxide film 5 is anisotropically etched using resist pattern 10c as an etching mask to form a contact hole 5a in silicon oxide film 5.

Referring to FIGS. 43 and 44, resist pattern 10c is removed by oxygen plasma ashing.

Referring next to FIGS. 44 and 45, metal interconnection material 12 such as tungsten silicide ($WSi_2$) is deposited to a thickness of about 1000 Å by sputtering or CVD. At this time, the metal interconnection material fills the inside of contact hole 5a.

Referring to FIG. 46, KrF excimer positive resist film 10 is again formed on semiconductor substrate 4. Exposure by the KrF excimer laser stepper is next performed using the second reticle 21 having interconnection patterns 3b and 3e drawn as shown in FIG. 40. Consequently, a latent image of the interconnection pattern is formed in KrF excimer positive resist film 10.

After bake at 110° C. for 90 seconds (PEB), development performed for 60 seconds using the aqueous solution containing 2.38% tetramethyl ammonium hydroxide (TMAH) by weight generates a resist pattern 10d in the form of the interconnection on semiconductor substrate 4 as shown in FIG. 47.

Referring to FIGS. 47 and 48, the layer of metal interconnection material 12 is anisotropically etched using resist pattern 10d as an etching mask, and a desired metal interconnection is produced.

Referring to FIGS. 48 and 49, resist pattern 10d is removed and an interconnection constituting a part of a semiconductor device is formed.

According to the conventional method of forming patterns, two reticles, the first reticle 19 where the contact hole pattern is formed and the second reticle 21 where interconnection patterns 3b and 3e are formed are used.

A manufacturing error generated during fabrication of reticles influences the conventional method. In other words, when patterns are drawn in a retide by electron beam, positional accuracy of the patterns on the reticle is deteriorated by the influence of accuracy of the stage of an EB lithography system, a positional accuracy of scanning beam, the adhesion state of deposited matter in the column in the system, lithography of blanks (glass substrate) of the reticle.

When the conventional method is applied to a device having a capacity on the level with 256M DRAM, it is confirmed that an overlay error due to a manufacturing error among reticles is about 10–20 nm.

Next, a problem is described that arises when an overlay error is generated in the photolithography.

Reforming to FIG. 50, the portion represented by the reference character $X_1$ corresponds to a region that should be opened. The portion represented by the reference character $X_2$ corresponds to a location occupied by an opening when the overlay error is generated. A shift between $X_1$ and $X_2$ corresponds to the portion represented by the reference character $Y_1$. As shown in FIG. 50, if patterning of an interconnection is executed with the overlay error generated, an interconnection having a pattern-shift $Y_2$ as shown in FIG. 51 is consequently produced.

Although shift $Y_2$ is generated in the lateral direction in FIGS. 50 and 51 as one example, various forms of shifts could be generated such as a shift in the direction of depth relative to the plane of the figure, for example. If such a form of shift is generated, the interconnection pattern will not be appropriately matched with a pattern of a higher layer, causing shortcircuit of the interconnections.

In order to reduce such a shift in overlay to achieve a higher overlay accuracy, a manufacturing error of reticles should be decreased. In addition, a method of generating patterns that restricts an influence due to the manufacturing error of reticles in generation of a resist pattern is necessary.

SUMMARY OF THE INVENTION

An object of the present invention is to provide a photomask improved to achieve reduction of a manufacturing error in the photomask.

Another object of the present invention is to provide a method of forming patterns improved to avoid pattern shift.

Still another object of the invention is to provide a method of forming patterns improved to restrict an overlay error due to a manufacturing error among reticles.

Still another object of the invention is to provide a method of forming a semiconductor device using such a photomask.

A photomask according to the first aspect of the invention includes a substrate, wherein both of an interconnection pattern and a contact hole pattern are drawn at the substrate.

A photomask according to the second aspect of the invention is provided with an absorption layer absorbing a certain ray formed at a part of the interconnection pattern and/or the contact hole pattern.

A method of forming patterns according to the third aspect of the invention uses a photomask where both of an interconnection pattern and a contact hole pattern are drawn to form the interconnection pattern and the contact hole pattern through exposure by rays of two types of wavelengths.

A method of forming patterns according to the fourth aspect of the invention uses a photomask provided with an absorption layer absorbing one of the rays of two types of wavelengths formed at a part of the interconnection pattern and/or the contact hole pattern.

According to a method of forming patterns of the fifth aspect, a photomask including both of an interconnection pattern and a contact hole pattern drawn at the mask is prepared. An interlayer insulating film is deposited on a semiconductor substrate. A first photoresist is formed on the interlayer insulating film. Using the photomask, a first ray is radiated to form a latent image of the contact hole pattern in the first photoresist. The first photoresist is developed to generate a resist pattern for the contact hole on the interlayer insulating film. Using the resist pattern for the contact hole, the interlayer insulating film is etched to generate in the interlayer insulating film a contact hole that exposes the surface of the semiconductor substrate. The resist pattern for the contact hole is removed. A metal interconnection layer is deposited on the interlayer insulating film to fill the contact hole by a part of the metal interconnection layer. A second photoresist is formed on the semiconductor substrate to cover the metal interconnection layer. The photomask is used again, a second ray is radiated to form a latent image of the interconnection pattern in the second photoresist. The second photoresist is developed to generate a resist pattern for the interconnection pattern on the interlayer insulating film. The resist pattern for the interconnection pattern is used to etch the metal interconnection layer and a metal interconnection pattern is generated. The resist pattern for the interconnection pattern is removed.

According to a method of forming patterns of the sixth aspect, after generating the interlayer insulating film and prior to forming the first photoresist, an etching stopper layer, having an opening at a region where the contact hole is formed larger than the diameter of the contact hole, is provided on the interlayer insulating film.

According to a method of forming patterns of the seventh aspect, a photomask provided with an absorption layer covering a portion where the interconnection pattern is drawn and absorbing the first ray is used.

According to a method of forming patterns of the eighth aspect, KrF excimer laser beam is used as the first ray, and i-line is used as the second ray.

According to a method of forming patterns of the ninth aspect, a photomask, including both of an interconnection pattern and a contact hole pattern drawn at the mask and having a portion where the interconnection pattern is drawn covered with an absorption layer absorbing a first ray, is prepared. An interlayer insulating film, an etching stopper layer, an oxide layer, a negative first photoresist are successively formed on a semiconductor substrate. Using the photomask, a second ray is radiated to generate a latent image of the interconnection pattern in the first photoresist. The first photoresist is developed to form a resist pattern for the interconnection pattern on the oxide layer. Using the resist pattern for the interconnection pattern as a mask, the oxide layer is etched to create an interconnection pattern formed of oxide. A positive second photoresist is deposited on the etching stopper layer to cover the interconnection pattern. The photomask is used again, the first ray is radiated, and a latent image of the contact hole pattern is formed in the second photoresist. The second photoresist is developed to generate a resist pattern for the contact hole on the etching stopper layer. Using the resist pattern for the contact hole, the etching stopper layer and the interlayer insulating film are etched to form a contact hole in the interlayer insulating film. The resist pattern for the contact hole is removed. A metal interconnection layer is formed on the semiconductor substrate to fill the inside of the contact hole by a part of the metal interconnection layer. The metal interconnection layer is etched back until the surface of the oxide layer is exposed. Accordingly, a metal interconnection pattern is generated.

According to a method of forming patterns of the tenth aspect, excimer laser beam is used as the first ray, and i-line is used as the second ray.

According to a method of forming a semiconductor device having an interconnection pattern and a contact hole pattern of the eleventh aspect, a photomask where both of an interconnection pattern and a contact hole pattern are drawn is prepared. A silicon oxide film is formed on a semiconductor substrate. A silicon nitride pattern having an opening portion provided at the portion where a contact hole is formed, is formed on the silicon oxide film. The opening portion is larger than the diameter of the contact hole. An excimer positive resist is formed on the silicon oxide film to cover the silicon nitride pattern. An excimer laser is radiated using the photomask to form a latent image of the contact hole pattern in the excimer positive resist. The excimer positive resist is developed to form a resist pattern for the contact hole on the silicon oxide film. The silicon oxide film is etched using the resist pattern for the contact hole to form in the silicon oxide film a contact hole that exposes a surface of the semiconductor substrate. The resist pattern for the contact hole and the silicon nitride pattern are removed. A metal interconnection layer is formed on the silicon oxide film to be partially buried in the contact hole. The i-line positive resist is formed on the semiconductor substrate to cover the metal interconnection layer. The i-line is radiated using the photomask again to form a latent image of the interconnection pattern in said i-line positive resist. The i-line positive resist is developed to form a resist pattern for the interconnection pattern on the silicon oxide film. The metal interconnection layer is etched using the resist pattern for the interconnection pattern to form a pattern of metal interconnection. The resist pattern for the interconnection pattern is removed.

According to a method of forming a method of forming a semiconductor substrate of the twelfth aspect, a semiconductor substrate is prepared. A photomask including both of an interconnection pattern and a contact hole pattern drawn at the mask is prepared. An interlayer insulating film is formed on a semiconductor substrate. A first photo resist is formed on the interlayer insulating film. Using the photomask, a first ray is radiated to form a latent image of the contact hole pattern in the first photo resist. The first photo resist is developed to generate a resist pattern for the contact hole on the interlayer insulating film. Using the resist pattern for the contact hole, the interlayer insulating film is etched to generate in the interlayer insulating film a contact hole that exposes the surface of the semiconductor substrate. The resist pattern for the contact hole is removed. A metal interconnection layer is formed on the interlayer insulating film to fill the contact hole by a part of the metal interconnection layer. A second photo resist is formed on the semiconductor substrate to cover the metal interconnection layer. The photomask is used again, a second ray is radiated to form a latent image of the interconnection pattern in the second photo resist. The second photo resist is developed to generate a resist pattern for the interconnection pattern on the interlayer insulating film. The resist pattern for the interconnection pattern is used to etch the metal interconnection layer and a metal interconnection pattern is generated. The resist pattern for the interconnection pattern is removed.

According to a method of forming a semiconductor device of thirteenth aspect, a semiconductor substrate is prepared. A photomask, including both of a interconnection pattern and a contact hole pattern drawn at the mask and having a portion where the interconnection pattern is drawn covered with an absorption layer that absorbs a first ray, is prepared. An interlayer insulating film, a etching stopper layer, an oxide layer, an negative first photo resist are successively formed on a semiconductor substrate. Using the photomask, a second ray is radiated to generate a latent image of the interconnection pattern in the first photo resist. The first photo resist is developed to form a resist pattern for the interconnection pattern on the oxide layer. Using the resist pattern for the interconnection pattern as a mask, the oxide layer is etched to create an interconnection pattern formed of oxide. A positive second photo resist is formed on the etching stopper layer to cover the interconnection pattern. The photomask is used again, the first ray is radiated, and a latent image of the contact hole pattern is formed in the second photo resist. The second photo resist is developed to generate a resist pattern for the contact hole on the etching stopper layer. Using the resist pattern for the contact hole, the etching stopper layer and the interlayer insulating film are etched to form a contact hole in the interlayer insulating film. The resist pattern for the contact hole is removed. A metal interconnection layer is formed on the semiconductor substrate to fill the inside of the contact hole by a part of the metal interconnection layer. The metal interconnection layer is etched back until a surface of the oxide layer is exposed to form a pattern of metal interconnection.

The photomask according to the first aspect includes both of the interconnection pattern and the contact hole pattern generated at the mask. Therefore, an overlay error due to a manufacturing error among reticles can be restricted by using this photomask to form patterns.

The photomask according to the second aspect is provided with the absorption layer that absorbs a certain ray formed at a part of the interconnection pattern and/or the contact hole pattern. Consequently, any ray directed to a portion other than a portion where patterns should be. formed can be blocked.

According to the method of forming patterns of the third aspect, the photomask where the interconnection pattern and the contact hole pattern are both created is used. Accordingly, an overlay error due to a manufacturing error among reticles can be restricted.

According to the method of forming patterns of the fourth aspect, the absorption layer absorbing one of rays of two types of wavelengths is provided at a part of the interconnection pattern and/or the contact hole pattern. Therefore, any ray directed to a portion other than a portion where patterns should be formed can be blocked.

According to the method of forming patterns of the fifth aspect, the photomask including both of the interconnection pattern and the contact hole pattern formed at the mask is utilized to generate patterns. Consequently, an overlay error due to a manufacturing error generated among reticles can be restricted.

According to the method of forming patterns of the sixth aspect, the etching stopper layer is deposited on the interlayer insulating film. Accordingly, when a contact hole is formed in the interlayer insulating film, a portion other than the portion where the contact hole is formed is prevented from being etched.

According to the method of forming patterns of the seventh aspect, the photomask provided with the absorption layer covering a portion where the interconnection pattern is formed and absorbing the first ray is used. Therefore, when patterns are generated by the first ray, the ray transmitted through the portion where the interconnection pattern is formed is absorbed.

According to the method of forming patterns of the eighth aspect, KrF excimer laser beam is used as the first ray, and i-line is used as the second ray to form a minute contact hole.

According to the method of forming patterns of the ninth aspect, the photomask has both the interconnection pattern and the contact hole pattern generated at the mask, and a portion of the mask where the interconnection pattern is formed is covered with the absorption layer which absorbs the first ray. The photomask can be used to restrict an overlay error due to a manufacturing error generated among reticles.

According to the method of forming patterns of the tenth aspect, KrF excimer laser beam is used as the first ray and i-line is used as the second ray to form a minute contact hole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

(First Embodiment)

Figure 1:
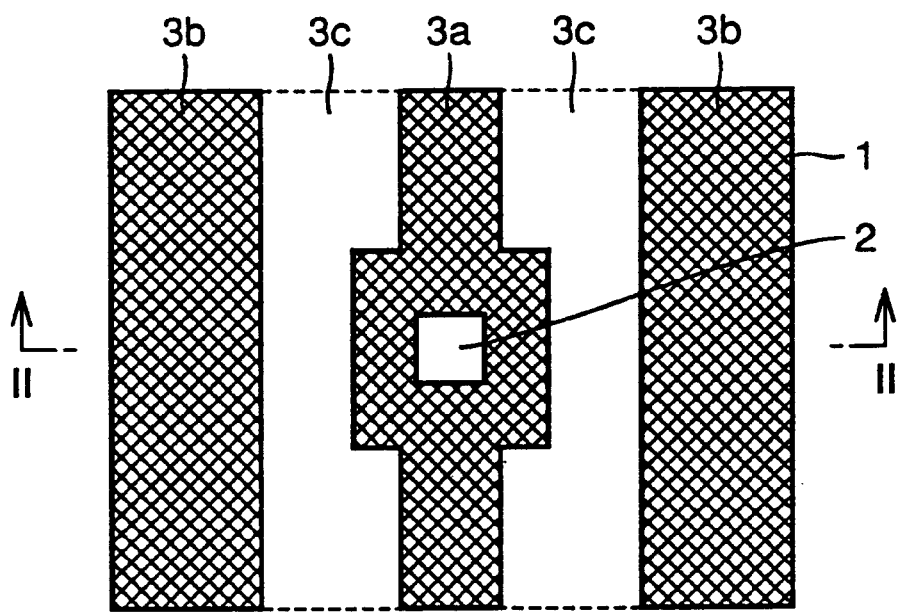
FIG. 1 is a plan view of a photomask used for a method of forming patterns according to the first embodiment.
Figure 2:
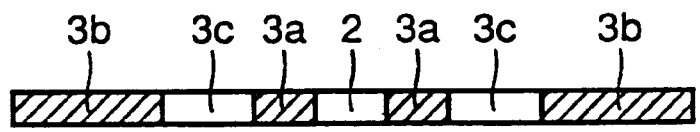
FIG. 2 is a cross sectional view along line II—II of the photomask shown in FIG. 1.

FIG. 1 is a plan view of a reticle used in the stage of photolithography in manufacturing a semiconductor device according to the first embodiment of the invention. FIG. 2 is a cross sectional view along line II—II in FIG. 1.

Referring to FIGS. 1 and 2, a contact hole pattern 2 formed of an opening, and interconnection patterns 3a and 3b formed of light blocking portions are drawn at a reticle 1. An opening portion 3c is formed between interconnection pattern 3a and interconnection pattern 3b. Interconnection pattern 3a which is in contact with contact hole pattern 2 has a connecting portion (contact cover portion). In order to provide enough margin for connection, the interconnection width of the connecting portion is made larger than that of other portions. The dimension of contact hole pattern 2 is 0.24 $\mu$m-square. The width of interconnection pattern 3a is 0.48 $\mu$m at the connecting portion, and the width of the other portions of interconnection pattern 3a is 0.4 $\mu$m.

Next, a method of manufacturing a semiconductor device using the reticle shown in FIG. 1 is described below.

Figure 3:
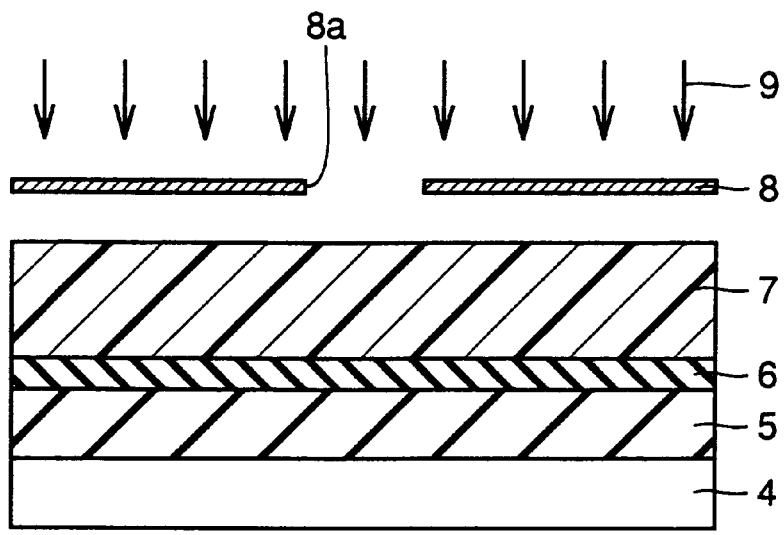
FIGS. 3–14 are cross sectional views respectively showing a semiconductor device in the first to the twelfth processes in the method of forming patterns according to the first embodiment.

Referring to FIG. 3, a silicon oxide film 5 (having a film thickness of approximately 3000 Å), and a silicon nitride film 6 (having a film thickness of approximately 1000 Å) are deposited on an underlying substrate (silicon wafer) 4. An i-line positive resist 7 (having a thickness of approximately 7000 Å) is applied onto silicon nitride film 6. The first photolithography is conducted using a first photomask 8 having an opening portion 8a provided at a portion where a contact hole is formed. Opening portion 8a is larger than the diameter of the contact hole. A stepper which uses i-line 9 as its source of rays is employed for exposure. Bake (PEB: Post Exposure Bake) is performed at 110° C. for 90 seconds. Development is next conducted for 60 seconds using an aqueous solution containing 2.38% tetramethyl ammonium hydroxide (TMAH) by weight. Consequently, a resist pattern 7a as shown in FIG. 4 is obtained.

Figure 4:
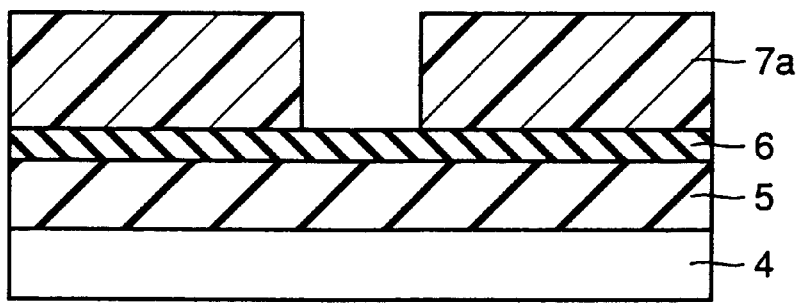
Figure 5:
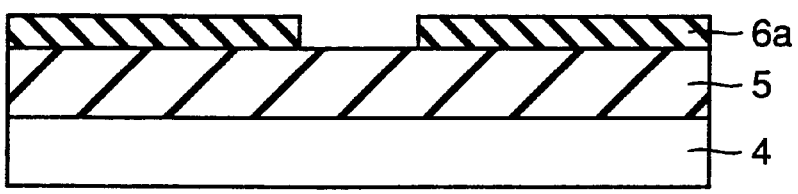

Referring to FIGS. 4 and 5, silicon nitride film 6 is etched using resist pattern 7a as a mask. Resist pattern 7a is thereafter removed and accordingly a silicon nitride film pattern 6a is generated.

Figure 6:
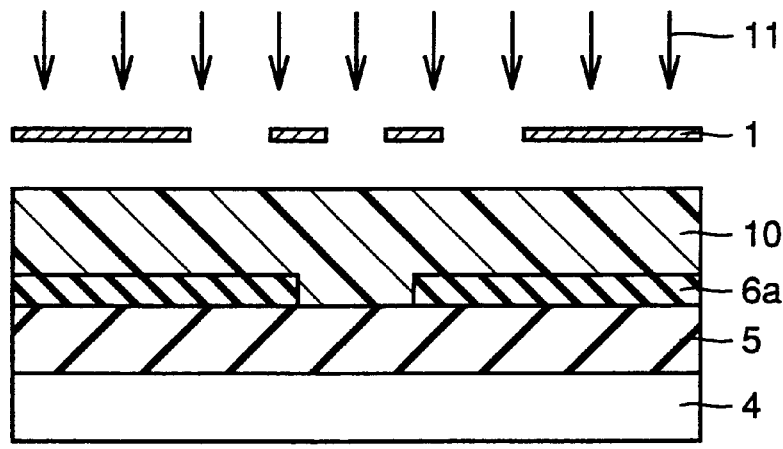

Referring to FIGS. 5 and 6, a KrF excimer positive resist 10 is applied onto substrate 4 to a thickness of about 7000 Å. Exposure is next performed by a stepper using KrF excimer laser beam 11 as the source of rays, using reticle 1 where the interconnection pattern and the contact hole pattern are simultaneously formed.

Figure 7:
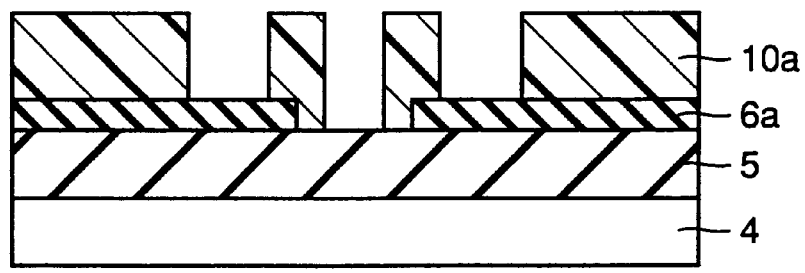

A PEB processing and a development processing are conducted at 110° C. for 90 seconds, and a resist pattern 10a as shown in FIG. 7 is obtained.

Figure 8:
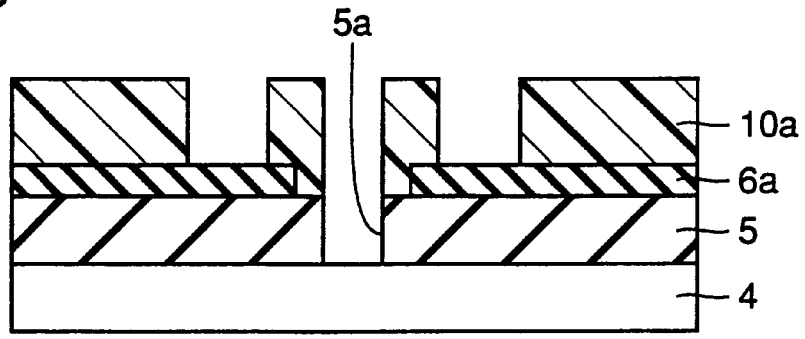

Referring to FIG. 8, underlying silicon oxide film 5 is etched using resist pattern 10a as a mask. Since the etch selectivity ratio between silicon oxide film 5 and silicon nitride film 6a is high, the portion of silicon oxide film 5 which is covered with silicon nitride film 6a is never etched.

Figure 9:
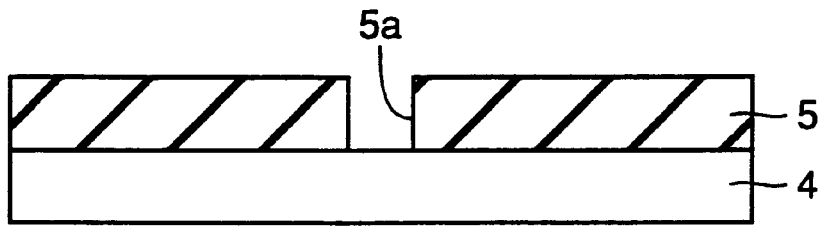

Referring to FIGS. 8 and 9, after removing resist pattern 10a, silicon nitride film 6a is removed. Accordingly, silicon oxide film 5 where contact hole 5a is generated is completed.

Figure 10:
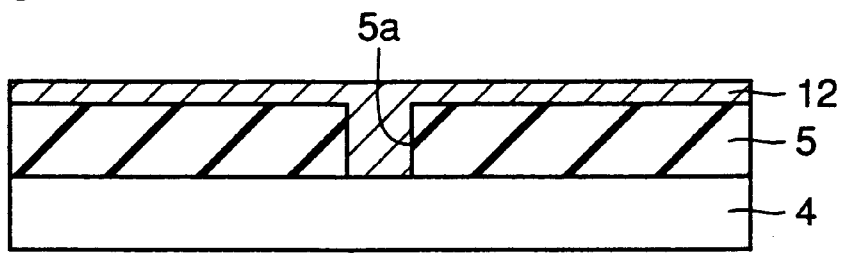

Referring to FIG. 10, metal interconnection material 12 such as tungsten silicide ($WSi_2$) is deposited on substrate 4 to a thickness of about 1000 Å by sputtering or CVD such that metal interconnection material 12 fills contact hole 5a.

Figure 11:
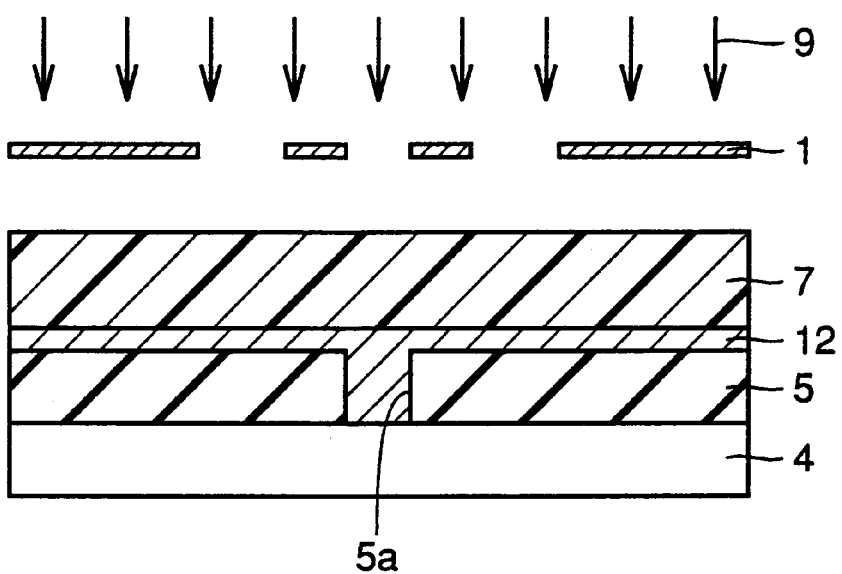

Referring to FIG. 11, i-line positive resist 7 is applied onto underlying substrate 4 to a thickness of about 7000 Å to cover metal interconnection material 12. Next reticle 1 used in the process shown in FIG. 6 is employed again for exposure by the i-line stepper. A latent image of the interconnection pattern is thus formed in i-line positive resist 7.

Figure 12:
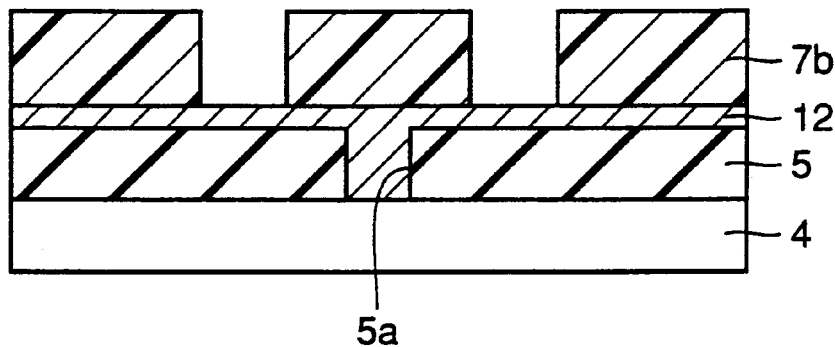

Referring to FIG. 12, the PEB processing and the development processing produce a resist pattern 7b where the interconnection pattern is created. Referring again to FIG. 11, using reticle 1, a latent image of the contact hole pattern is also formed in the i-line positive resist. However, when the i-line positive resist is used, the resolution of the contact hole portion becomes insufficient since the diameter of the contact hole is too small to generate the contact hole. As a result, the pattern of the contact hole is not formed and resist pattern 7b having only the interconnection pattern is obtained.

Figure 13:
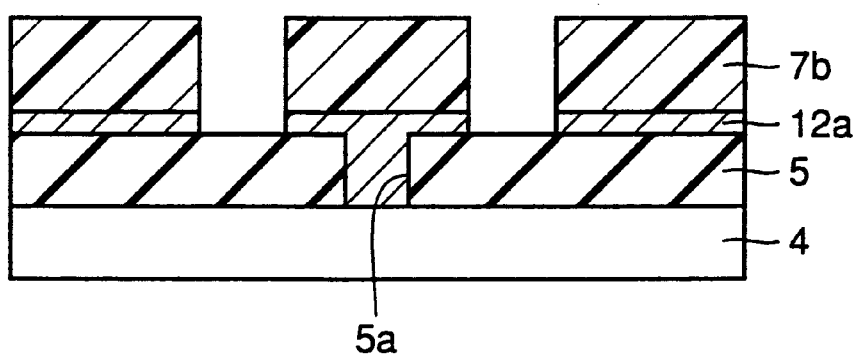

Referring to FIGS. 12 and 13, metal interconnection material 12 is etched using resist pattern 7b as a mask.

Figure 14:
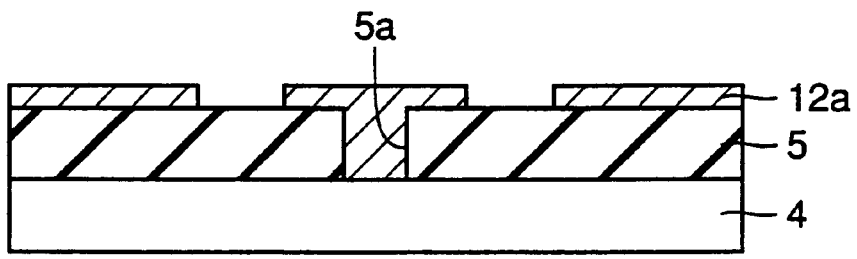

Referring to FIGS. 13 and 14, resist pattern 7b is removed to form a metal interconnection pattern 12a partially connected to underlying substrate 4 through contact hole 5a.
(Second Embodiment)

Figure 15:
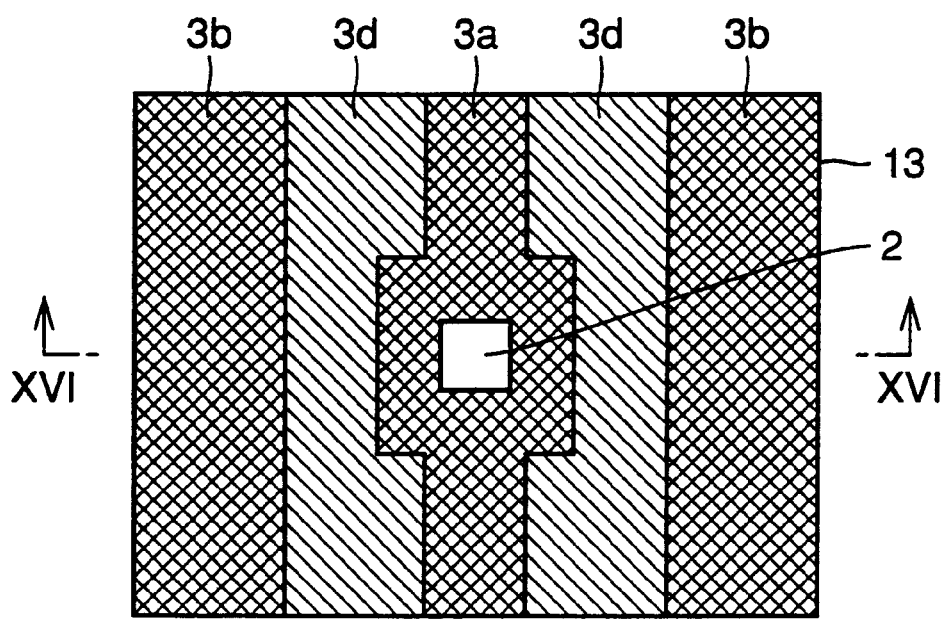
FIG. 15 is a plan view of a reticle used in manufacturing a semiconductor device according to the second embodiment.
Figure 16:
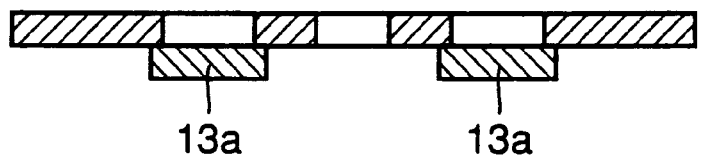
FIG. 16 is a cross sectional view along line XVI—XVI in FIG. 15.

FIG. 15 is a plan view of a reticle employed in manufacturing a semiconductor device according to the second embodiment. FIG. 16 is a cross sectional view along line XVI—XVI in FIG. 15.

Referring to FIGS. 15 and 16, a contact hole pattern 2 formed of an opening and interconnection patterns 3a and 3b formed of light blocking portions are drawn at a reticle 13. An opening portion 3d is formed between interconnection patterns 3a and 3b. An absorption layer 13a that absorbs the excimer laser beam is formed at opening portion 3d.

Next, a method of generating patterns using such a reticle is described.

Figure 17:
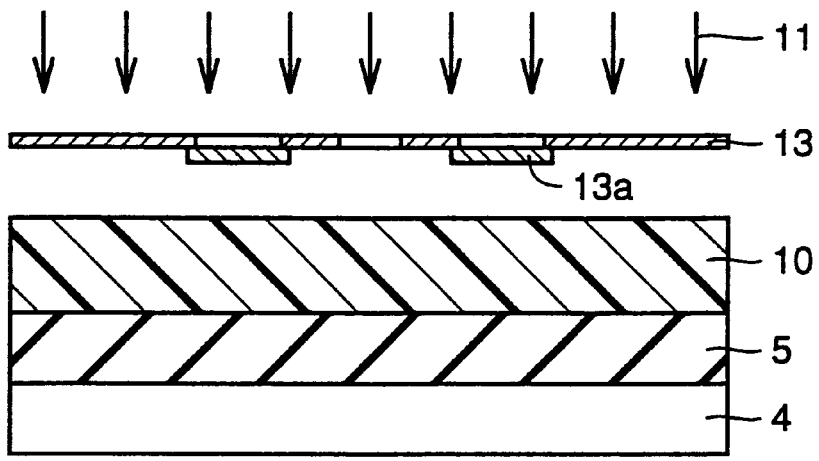
FIGS. 17–25 are cross sectional views respectively showing a semiconductor device in the first to the ninth processes of the method of forming patterns according to the second embodiment.

Referring to FIG. 17, a silicon oxide film 5 is deposited on an underlying substrate 4 to a thickness of approximately 3000 Å. A KrF excimer positive resist 10 is applied onto silicon oxide film 5 to a thickness of about 7000 Å. Using reticle 13 where the interconnection patterns and the contact hole pattern are drawn, exposure by a KrF excimer laser stepper is performed. KrF excimer laser beam 11 is transmitted only through the contact hole portion of reticle 13, and KrF excimer laser beam 11 is absorbed by absorption layer 13a at opening portion 3d.

Figure 18:
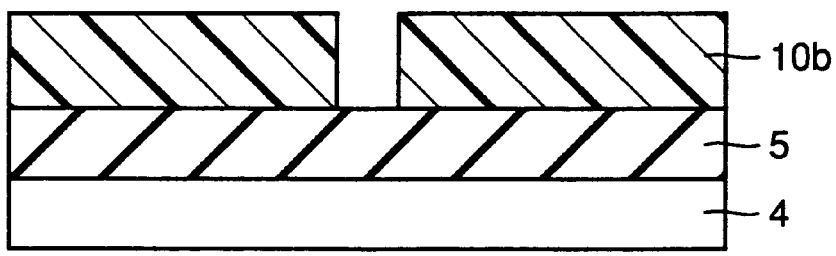

Referring to FIG. 18, a PEB processing and a development processing are conducted to form a resist pattern 10b where only a contact hole portion is formed.

Figure 19:
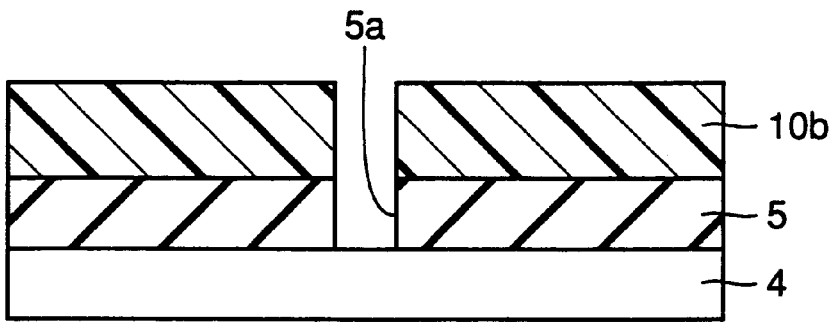

Referring to FIG. 19, underlying silicon oxide film 5 is etched using resist pattern 10b as a mask.

Figure 20:
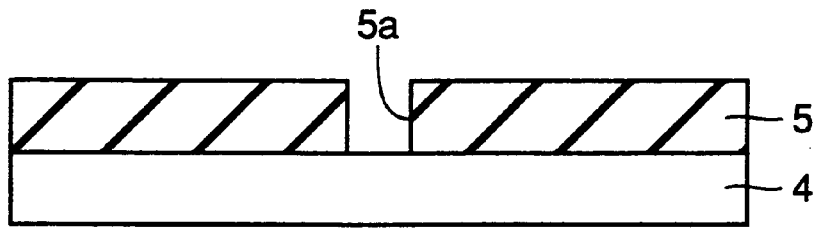

Referring to FIGS. 19 and 20, resist pattern 10b is removed and silicon oxide film 5 where a contact hole 5a is generated remains on underlying substrate 4.

Figure 21:
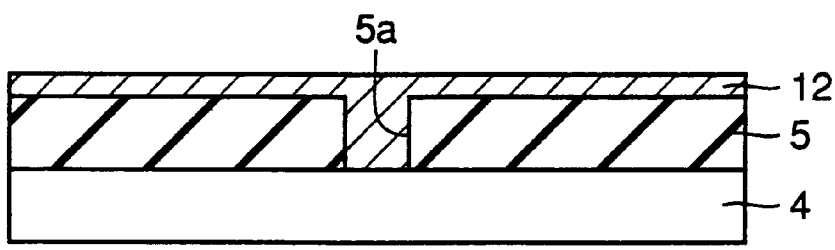

Referring to FIG. 21, metal interconnection material 12 such as tungsten silicide ($WSi_2$) is deposited on underlying substrate 4 to a thickness of approximately 1000 Å by sputtering or CVD. Metal interconnection material 12 is formed on underlying substrate 4 such that a part thereof is buried within the contact hole.

Figure 22:
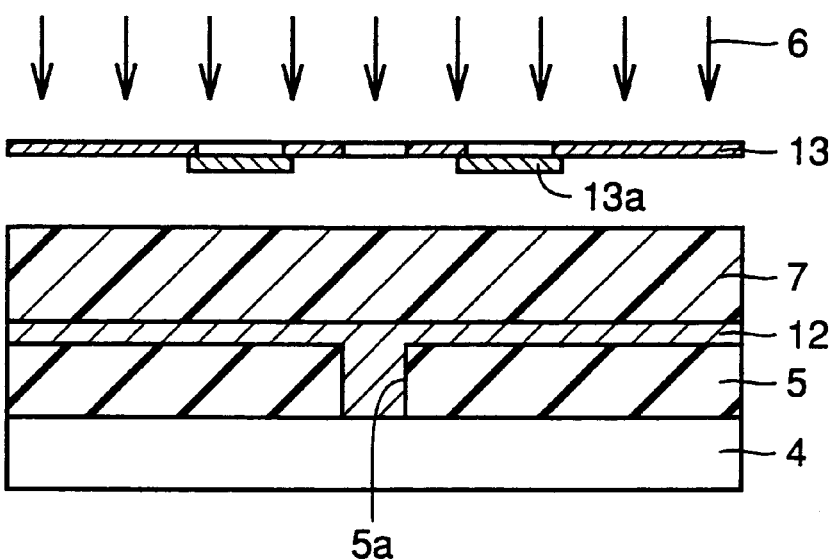

Referring to FIG. 22, an i-line positive resist 7 is applied onto underlying substrate 4 to a thickness of about 7000 Å to cover metal interconnection material 12. Reticle 13 shown in FIG. 15 is used again for exposure by an i-line stepper.

Figure 23:
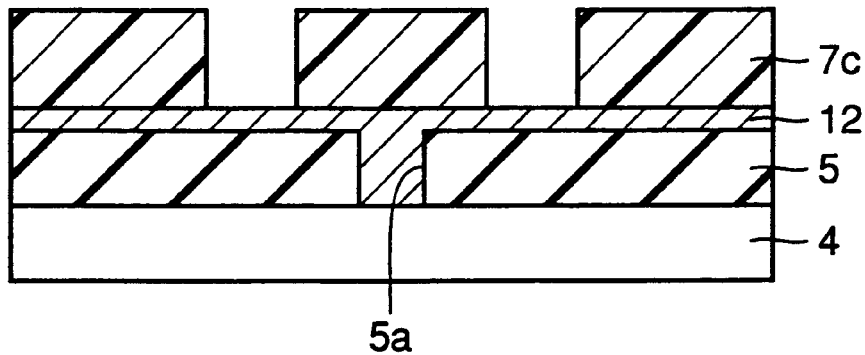

A resist pattern 7c is obtained where the interconnection pattern as shown in FIG. 23 is generated by the PEB processing and the development processing. Referring to FIG. 22, according to this method, when reticle 13 is used, a latent image of the contact hole pattern is formed in the i-line positive resist. However, the diameter of the contact hole is too small to open a contact hole. Therefore, the resolution is insufficient at the contact hole portion. Accordingly, the contact hole pattern is not formed in i-line positive resist 7.

Figure 24:
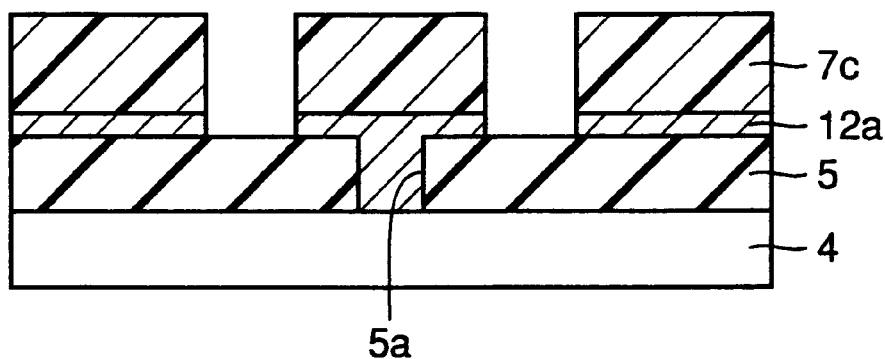

Referring to FIGS. 23 and 24, metal interconnection material 12 is etched using resist pattern 7c as a mask.

Figure 25:
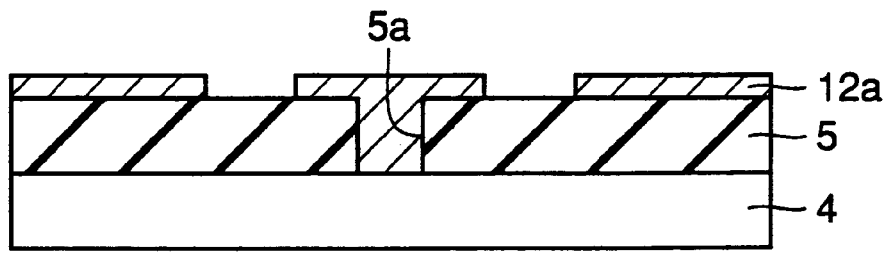

Referring to FIGS. 24 and 25, resist pattern 7c is removed and a metal interconnection pattern 12a partially connected to underlying substrate 4 through the contact hole is formed.
(Third Embodiment)

Figure 26:
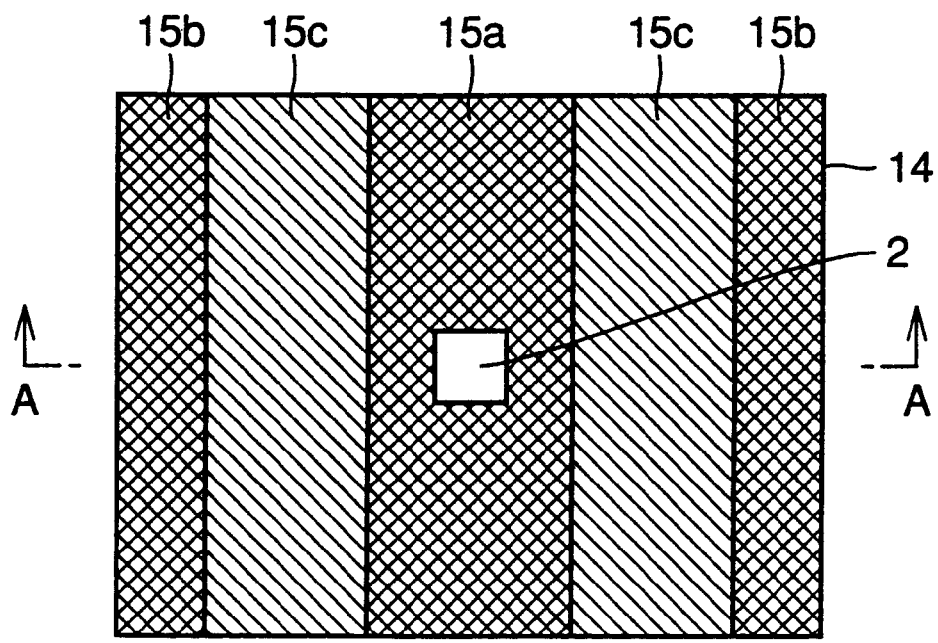
FIG. 26 is a plan view of a photomask used for a method of forming patterns according to the third embodiment.
Figure 27:
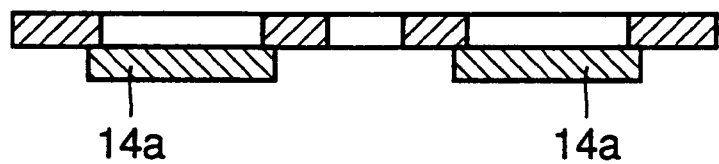
FIG. 27 is a cross sectional view along line A—A in FIG. 26.

FIG. 26 is a plan view of a reticle employed for a method of forming patterns according to the third embodiment. FIG. 27 is a cross sectional view along line A—A in FIG. 26. Referring to FIGS. 26 and 27, a contact hole pattern 2 formed of an opening and interconnection patterns 15a and 15b formed of light blocking portions are drawn at a reticle 14. An opening portion 15c is formed between interconnection pattern 15a and interconnection pattern 15b. An absorption layer 14a that absorbs KrF excimer laser beam is provided to opening portion 15c.

A method of forming patterns using the reticle shown in FIG. 26 is next described.

Figure 28:
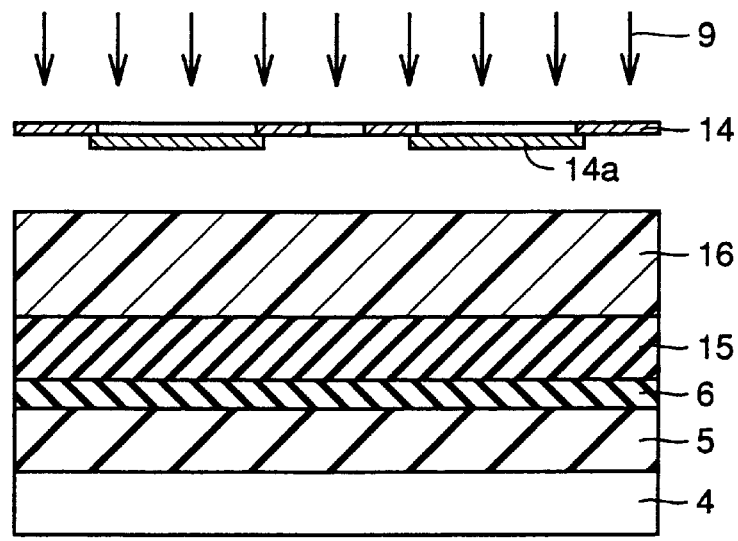
FIGS. 28–36 are cross sectional views respectively showing a semiconductor device in the first to the ninth processes of the method of forming patterns according to the third embodiment.
Figure 29:
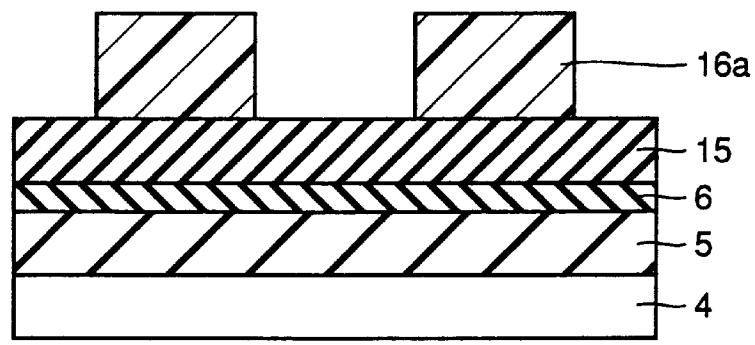

Referring to FIG. 28, a silicon oxide film 5 is deposited on an underlying substrate 4 to a thickness of approximately 3000 Å. A silicon nitride film 6 is formed on silicon oxide film 5 to a thickness of about 1000 Å. A silicon oxide film 15 is deposited on silicon nitride film 6 to a thickness of about 3000 Å. An i-line negative resist 16 is applied onto silicon oxide film 15 to a thickness of about 7000 Å. Reticle 14 shown in FIG. 26 is used for exposure by an i-line stepper. Following this, a PEB processing and a development processing are performed to generate a resist pattern 16a shown in FIG. 29. Although the contact hole portion of i-line negative resist 16 is exposed, the diameter of the contact hole is too small to be sufficiently sensitive to radiation. Therefore, the resist pattern is not left at the portion where the contact hole is to be formed.

Figure 30:
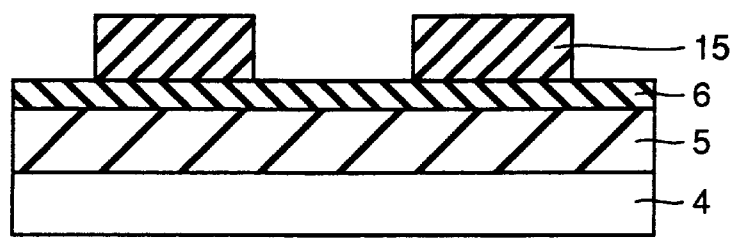

Referring to FIG. 30, silicon oxide film 15 is etched using resist pattern 16a as a mask. The etch selectivity between silicon oxide film 15 and silicon nitride film 6 is high so that only silicon oxide film 15 is etched and silicon nitride film 6 is not etched. Resist pattern 16a is thereafter removed, and a semiconductor device having a pattern of the silicon oxide film left on nitride film 6 is obtained.

Figure 31:
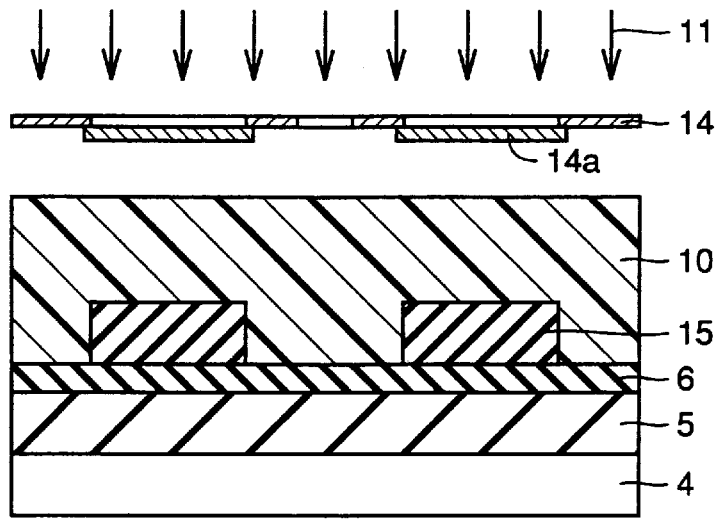

Referring to FIG. 31, a KrF excimer positive resist 10 is applied onto nitride film 6 to a thickness of about 7000 Å to cover the pattern of silicon oxide film 15. Exposure is performed by a KrF excimer laser stepper using reticle 14 shown in FIG. 26 again. Excimer laser 11 is transmitted through only the contact hole pattern, and laser 11 is absorbed by absorption layer 14a at opening portion 15c.

Figure 32:
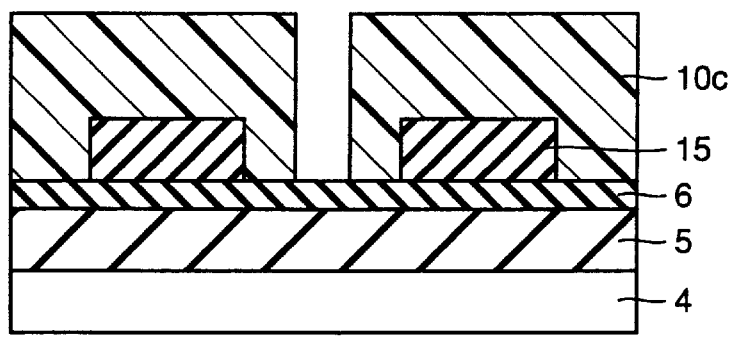

Referring to FIGS. 31 and 32, a PEB processing and a development processing are performed and resist pattern 10c having an opening at the contact hole portion is obtained.

Figure 33:
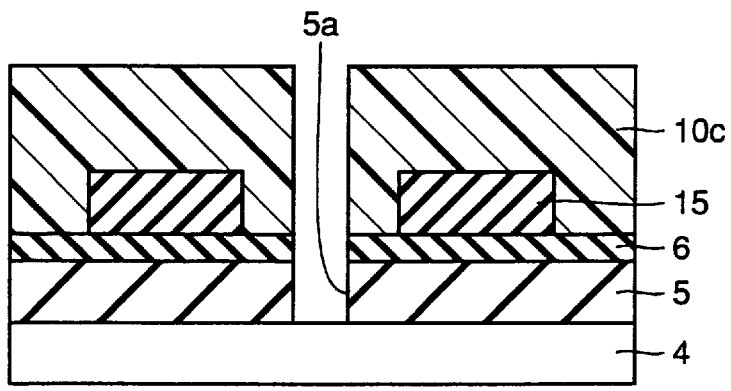
Figure 34:
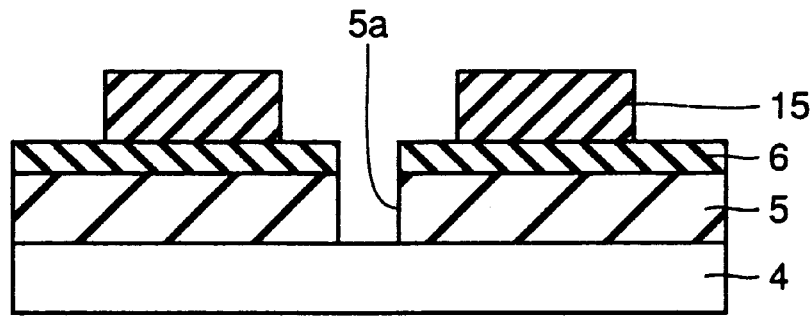

Referring to FIG. 33, underlying silicon nitride film 6 and silicon oxide film 5 are etched using resist pattern 10c as a mask. Referring to FIGS. 33 and 34, resist pattern 10c is thereafter removed.

Figure 35:
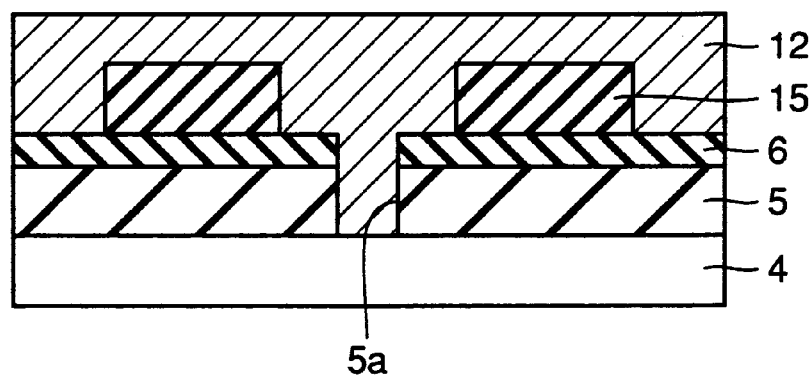

Referring to FIG. 35, metal interconnection material 12 such as tungsten silicide ($WSi_2$) is deposited on underlying substrate 4 to a thickness of about 3500 Å by sputtering or CVD such that metal interconnection material 12 fills the contact hole portion formed in silicon oxide film 5.

Figure 36:
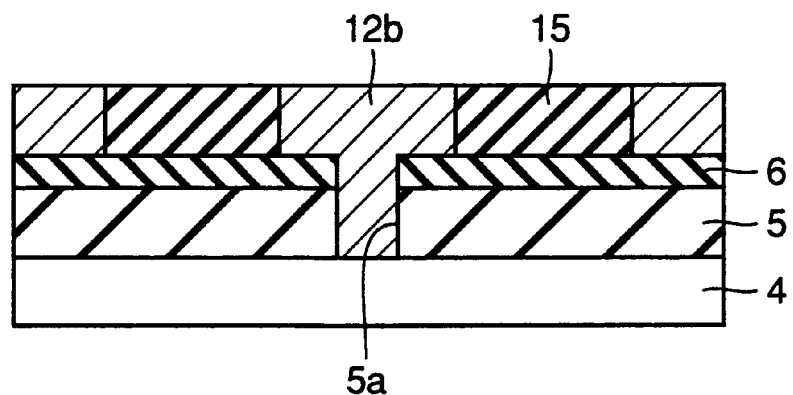

Referring to FIGS. 35 and 36, metal interconnection material 12 is polished until the surface of silicon oxide film 15 is exposed by chemical mechanical polishing (CMP). Accordingly, an interconnection pattern 12b partially connected to underlying substrate 4 through contact hole is obtained.

(Fourth Embodiment)

Figure 37:
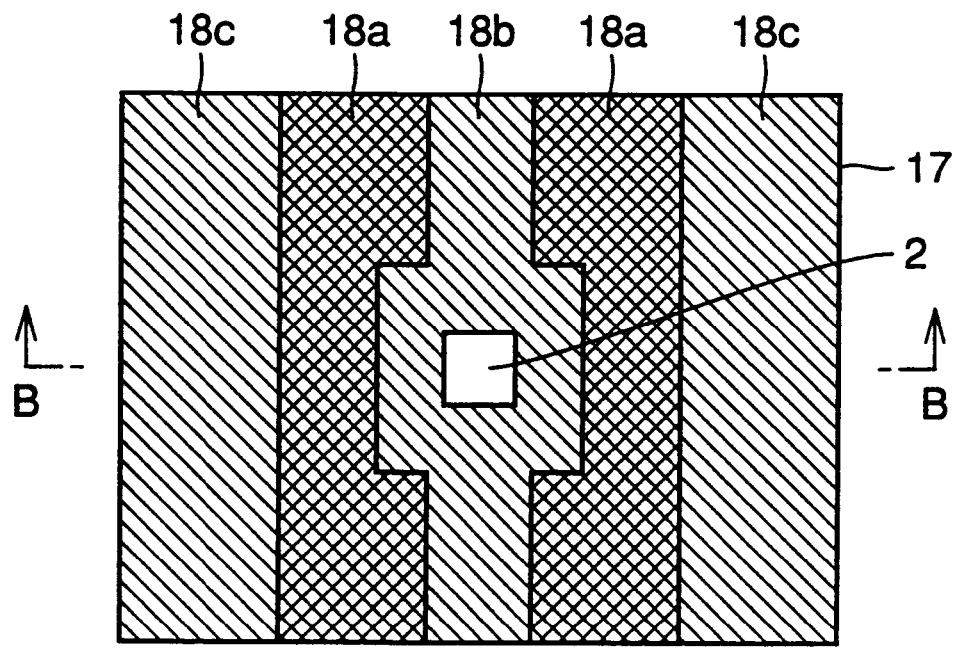
FIG. 37 is a plan view illustrating a specific example of another embodiment of the invention.
Figure 38:
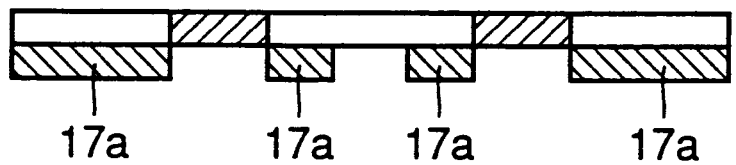
FIG. 38 is a cross sectional view along line B—B in FIG. 37.
Figure 39:
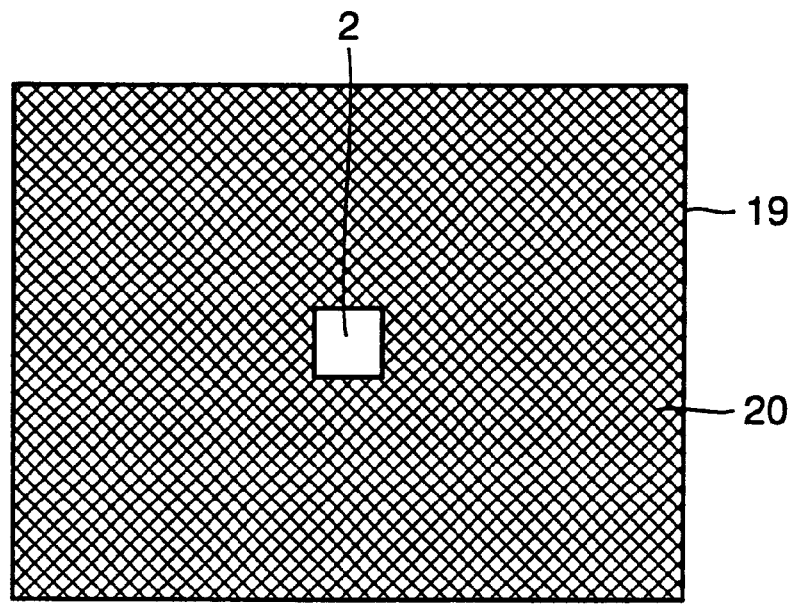
FIG. 39 is a plan view of a conventional reticle used for exposure of a pattern of a contact hole.
Figure 40:
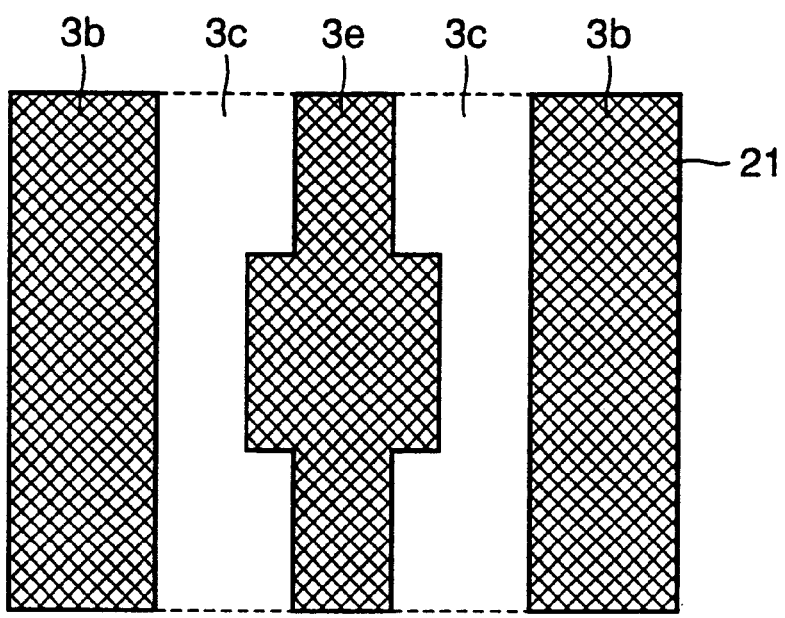
FIG. 40 is a plan view of a conventional reticle used for exposure of an interconnection pattern.
Figure 41:
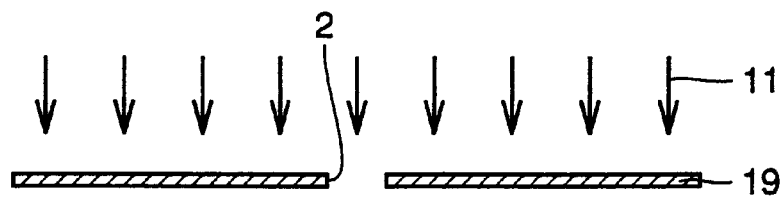
FIGS. 41–49 are cross sectional views respectively showing a semiconductor device in the first to the ninth processes of a conventional method of forming patterns.
Figure 42:
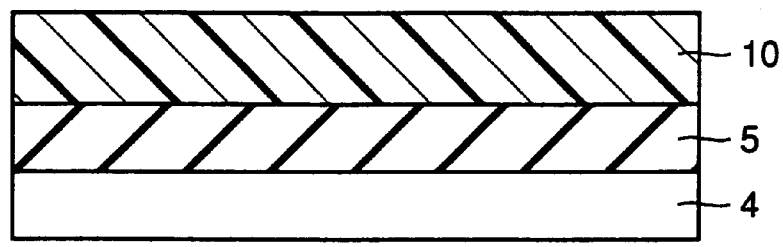
Figure 43:
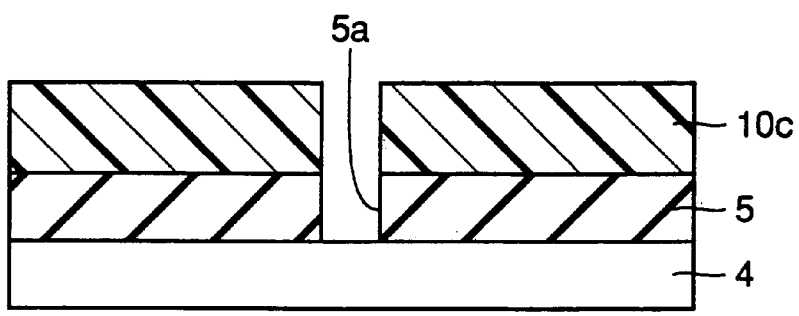
Figure 44:
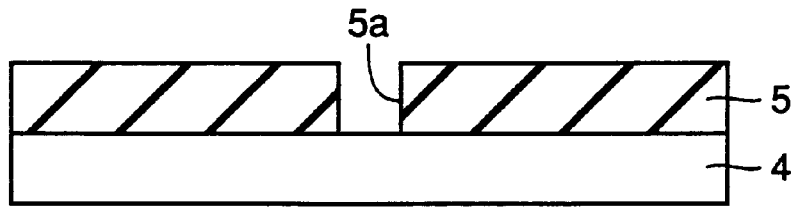
Figure 45:
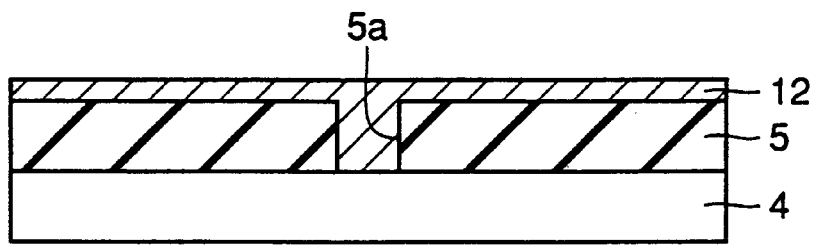
Figure 46:
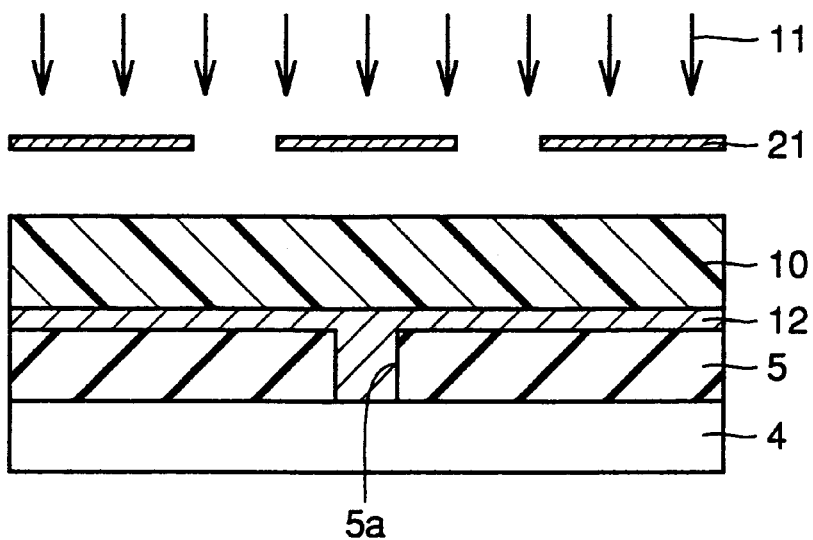
Figure 47:
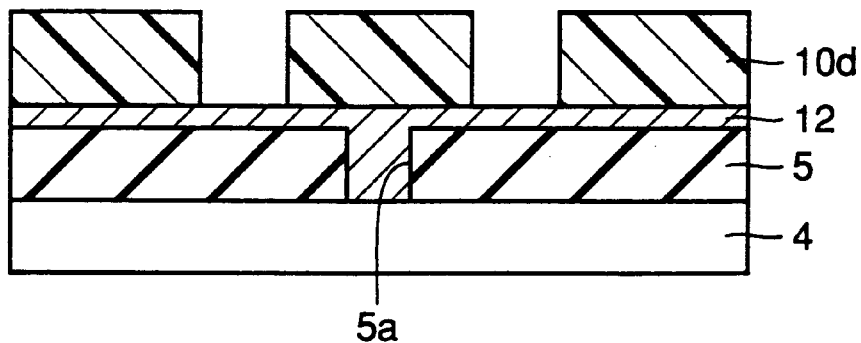
Figure 48:
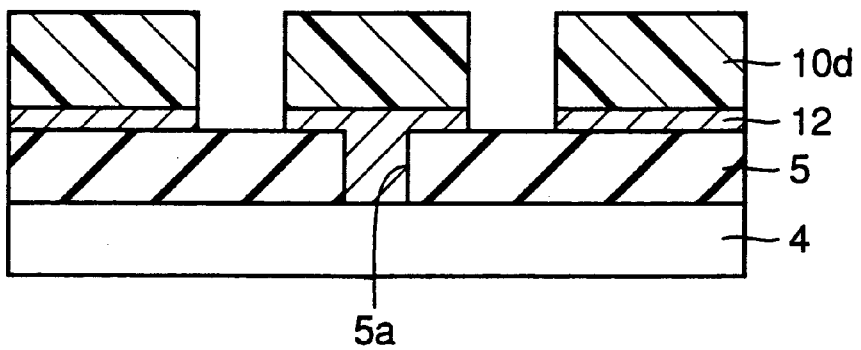
Figure 49:
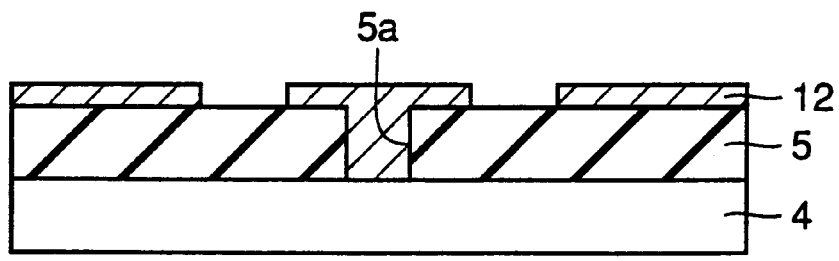
Figure 50:
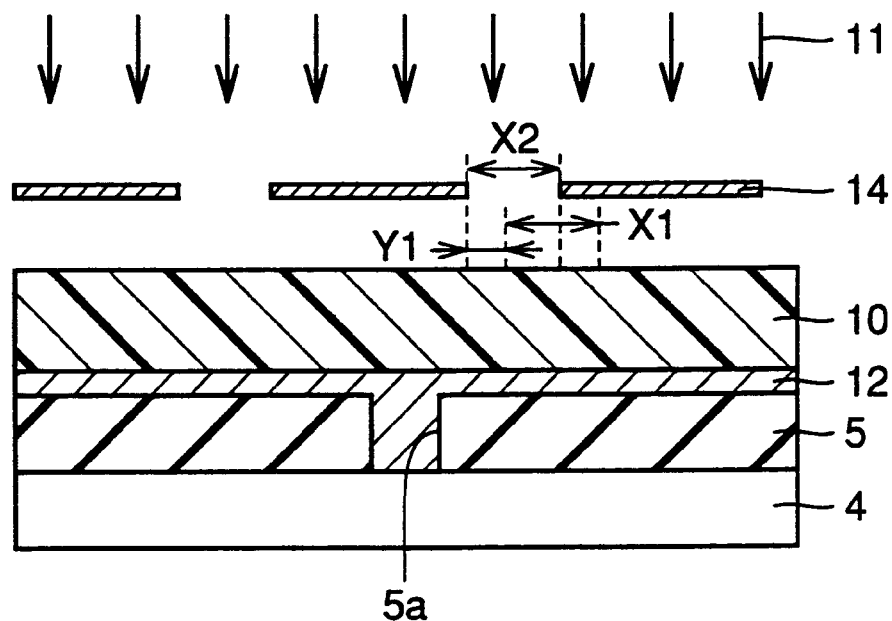
FIG. 50 is a first drawing illustrating a problem in the conventional method of forming patterns.
Figure 51:
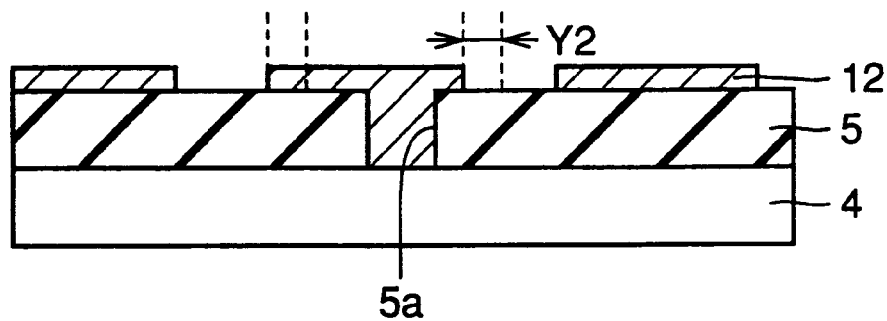
FIG. 51 is a second drawing illustrating a problem in the conventional method of forming patterns.

FIG. 37 is a plan view of another specific example of the reticle applicable to the method of forming patterns according to the present invention. FIG. 38 is a cross sectional view along line B—B in FIG. 37.

Referring to FIGS. 37 and 38, a contact hole pattern 2 formed of an opening and an absorption layer 17a is provided at a reticle 17. Absorption layer 17a that absorbs one of two types of rays used for pattern generation is provided at interconnection patterns 18b and 18c formed of openings. A light blocking portion 18a is provided between interconnection pattern 18b and interconnection pattern 18c. Patterns can be created by the flow as shown in FIGS. 3–14 or FIGS. 17–25 by using such a reticle and employing a negative resist when the interconnection is formed. Patterns can also be generated by the flow shown in FIGS. 28–36 by using this reticle and employing a positive resist when the interconnection is formed.

In the embodiments above of the present invention, the i-line and KrF excimer laser beam are exemplified. The shorter the wavelength of light is, generally the more the light is absorbed. If any appropriate material is selected for each wavelength as an absorption layer formed at a photomask in the embodiments above, it is possible to use any ray having another wavelength. According to the pattern size, any ray having a wavelength such as that of g-line, i-line, KrF beam, or ArF beam can be selected.

As the material for the absorption layer, metal oxide such as chromium fluoride oxide ($CrF_xO_y$), molybdenum silicide oxide nitride ($MoSi_xO_yN_z$) are preferable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming patterns using a photomask, comprising the steps of:

preparing said photomask where both of interconnection pattern and a contact hole pattern are drawn to form an interconnection pattern and a contact hole pattern, a portion of said interconnection pattern and/or said contact hole pattern is covered with an absorption layer, exposing said interconnection pattern and said contact hole pattern to rays of two different wavelengths, wherein said absorption layer absorbs one of said rays.

2. A method of forming patterns according to claim 1, comprising the steps of:

preparing said photomask where both of an interconnection pattern and a contact hole pattern are drawn;

forming an interlayer insulating film on a semiconductor substrate;

forming a first photoresist on said interlayer insulating film;

radiating a first ray using said photomask to form a latent image of said contact hole pattern in said first photoresist;

developing said first photoresist to form a resist pattern for a contact hole on said interlayer insulating film;

etching said interlayer insulating film using said resist pattern for the contact hole to form in said interlayer insulating film a contact hole that exposes a surface of said semiconductor substrate;

removing said resist pattern for the contact hole;

forming a metal interconnection layer on said interlayer insulating film to be partially buried in said contact hole;

forming a second photoresist on said semiconductor substrate to cover said metal interconnection layer;

radiating a second ray using said photomask again to form a latent image of said interconnection pattern in said second photoresist;

developing said second photoresist to form a resist pattern for the interconnection pattern on said interlayer insulating film;

etching said metal interconnection layer using said resist pattern for the interconnection pattern to form a pattern of metal interconnection; and removing said resist pattern for the interconnection pattern.

3. The method of forming patterns according to claim 2, further comprising a step of providing an etching stopper layer having at a region where said contact hole is formed an opening portion larger than a diameter of said contact hole, on said interlayer insulating film, after forming said interlayer insulating film and prior to forming said first photoresist.

4. The method of forming patterns according to claim 2, wherein an absorption layer that absorbs said first ray is provided at said photomask to cover a portion where said interconnection pattern is drawn.

5. The method of forming patterns according to claim 2, wherein said first ray is KrF excimer laser beam and said second ray is i-line.

6. A method of forming patterns comprising the steps of:

preparing a photomask where both of an interconnection pattern and a contact hole pattern are drawn, a portion where said interconnection pattern is drawn covered with an absorption layer that absorbs a first ray;

forming successively an interlayer insulating film, an etching stopper layer, an oxide layer, and a negative first photoresist on a semiconductor substrate;

radiating a second ray using said photomask to form a latent image of the interconnection pattern in said first photoresist;

developing said first photoresist to form a resist pattern for the interconnection pattern on said oxide layer;

etching said oxide layer using said resist pattern for the interconnection pattern as a mask to form an interconnection pattern formed of oxide;

forming a positive second photoresist on said etching stopper layer to cover said interconnection pattern;

radiating said first ray using said photomask again to form a latent image of the contact hole pattern in said second photoresist;

developing said second photoresist to form a resist pattern for a contact hole on said etching stopper layer;

etching said etching stopper layer and said interlayer insulating film using said resist pattern for the contact hole to form a contact hole in said interlayer insulating film;

removing said resist pattern for the contact hole; and forming a metal interconnection layer on said semiconductor substrate to be partially buried in said contact hole; and etching back said metal interconnection layer until a surface of said oxide layer is exposed to form a pattern of metal interconnection.

7. The method of forming patterns according to claim 6, wherein said first ray is KrF excimer laser, and said second ray is i-line.

8. The method of forming a semiconductor device having an interconnection pattern and a contact hole pattern using a photomask comprising the steps of:

preparing said photomask where both of an interconnection pattern and a contact hole pattern are drawn, a portion of said interconnection pattern is covered with an absorption layer that absorbs radiation from an excimer laser, but not i-line radiation;

forming a silicon oxide film on said semiconductor substrate;

forming on said silicon oxide film a silicon nitride pattern having an opening portion provided at the portion where a contact hole is formed, said opening portion being larger than the diameter of the contact hole;

forming an excimer positive resist on said silicon oxide film to cover said silicon nitride pattern;

radiating said excimer laser using said photomask to form a latent image of said contact hole pattern in said excimer positive resist;

developing said excimer positive resist to form a resist pattern for the contact hole on said silicon oxide film;

etching said silicon oxide film using said resist pattern for the contact hole to form in said silicon oxide film a contact hole that exposes a surface of said semiconductor substrate;

removing said resist pattern for the contact hole and said silicon nitride pattern;

forming a metal interconnection layer on said silicon oxide film to be partially buried in said contact hole;

forming i-line positive resist on said semiconductor substrate to cover said metal interconnection layer;

radiating i-line using said photomask again to form a latent image of said interconnection pattern in said i-line positive resist;

developing said i-line positive resist to form a resist pattern for the interconnection pattern on said silicon oxide film;

etching said metal interconnection layer using said resist pattern for the interconnection pattern to form a pattern of metal interconnection; and removing said resist pattern for the interconnection pattern.

9. The method of forming a semiconductor device having an interconnection pattern and a contact hole pattern using a photomask comprising the steps of:

preparing a semiconductor substrate;

preparing said photomask where both of an interconnection pattern and a contact hole pattern are drawn, a portion of said interconnection pattern is covered with an absorption layer that absorbs radiation from a first ray, but radiation from a second ray;

forming an interlayer insulating film on said semiconductor substrate;

forming a first photo resist on said interlayer insulating film;

radiating said first ray using said photomask to form a latent image of said contact hole pattern in said first photo resist;

developing said first photo resist to form a resist pattern for a contact hole on said interlayer insulating film;

etching said interlayer insulating film using said resist pattern for the contact hole to form in said interlayer insulating film a contact hole that exposes a surface of said semiconductor substrate;

removing said resist pattern for the contact hole;

forming a metal interconnection layer on said interlayer insulating film to be partially buried in said contact hole;

forming a second photo resist on said semiconductor substrate to cover said metal interconnection layer;

radiating said second ray using said photomask again to form a latent image of said interconnection pattern in said second photo resist;

developing said second photo resist to form a resist pattern for the interconnection pattern on said interlayer insulating film;

etching said metal interconnection layer using said resist pattern for the interconnection pattern to form a pattern of metal interconnection; and removing said resist pattern for the interconnection pattern.

10. The method of forming a semiconductor device according to claim 9, further comprising a step of providing an etching stopper layer having a region where said contact hole is formed an opening portion larger than a diameter of said contact hole, on said interlayer insulating film, after forming said interlayer insulating film and prior to forming said first photo resist.

11. The method of forming a semiconductor device according to claim 9, wherein an absorption layer that absorbs said first ray is provided at said photomask to cover a portion where said interconnection pattern is drawn.

12. The method of forming a semiconductor device according to claim 9, wherein said first ray is KrF excimer laser beam and said second ray is i-line.

13. A method of forming a semiconductor device having an interconnection pattern and a contact hole pattern using a photomask comprising the steps of:

preparing a semiconductor substrate;

preparing said photomask where both of an interconnection pattern and a contact hole pattern are drawn, a portion where said interconnection pattern is drawn covered with an absorption layer that absorbs radiation from a first ray, but not radiation from a second ray;

forming successively an interlayer insulating film, an etching stopper layer, an oxide layer, and a negative first photo resist on a semiconductor substrate;

radiating said second ray using said photomask to form a latent image of the interconnection pattern in said first photo resist;

developing said first photo resist to form a resist pattern for the interconnection pattern on said oxide layer;

etching said oxide layer using said resist pattern for the interconnection pattern as a mask to form a interconnection pattern formed of oxide;

forming a positive second photo resist on said etching stopper layer to cover said interconnection pattern;

radiating said first ray using said photomask again to form a latent image of the contact hole pattern in said second photo resist;

developing said photo resist to form a resist pattern for a contact hole on said etching stopper layer;

etching said etching stopper layer and said interlayer insulating film using said resist pattern for the contact hole to form a contact hole in said interlayer insulating film, removing said resist pattern for the contact hole; and forming a metal interconnection layer on said semiconductor substrate to be partially buried in said contact hole; and etching back said metal interconnection layer until a surface of said oxide layer is exposed to form a pattern of metal interconnection.

14. The method of forming a semiconductor device according to claim 13, wherein said first layer is KrF excimer laser, and said second ray is i-line.

* * * * *